United States Patent
Kim et al.

(10) Patent No.: US 9,893,139 B2
(45) Date of Patent: Feb. 13, 2018

(54) DISPLAY APPARATUS

(71) Applicant: SAMSUNG DISPLAY CO., LTD., Yongin-si, Gyeonggi-Do (KR)

(72) Inventors: Yangwan Kim, Yongin-si (KR); Sunja Kwon, Yongin-si (KR); Byungsun Kim, Yongin-si (KR); Hyunae Park, Yongin-si (KR); Sujin Lee, Yongin-si (KR); Jaeyong Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/336,232

(22) Filed: Oct. 27, 2016

(65) Prior Publication Data
US 2017/0288008 A1 Oct. 5, 2017

(30) Foreign Application Priority Data
Mar. 31, 2016 (KR) .................. 10-2016-0039329

(51) Int. Cl.
*H01L 33/62* (2010.01)
*H01L 27/32* (2006.01)
(Continued)

(52) U.S. Cl.
CPC ....... *H01L 27/3279* (2013.01); *G09G 3/3258* (2013.01); *G09G 3/3266* (2013.01); *G09G 3/3291* (2013.01); *H01L 27/3206* (2013.01); *H01L 51/0097* (2013.01); *G09G 2300/0452* (2013.01); *G09G 2300/0809* (2013.01); *G09G 2320/0209* (2013.01)

(58) Field of Classification Search
CPC ...... H01L 51/0545; H01L 33/60; H01L 33/62
See application file for complete search history.

(56) References Cited

U.S. PATENT DOCUMENTS

| 6,531,815 | B1 | 3/2003 | Okuyama et al. |
| 9,543,371 | B2 * | 1/2017 | Kim ................. H01L 27/3276 |
| 2011/0133215 | A1 | 6/2011 | Kang et al. |

FOREIGN PATENT DOCUMENTS

KR   1020160019353   2/2016

OTHER PUBLICATIONS

European Search Report issued by the EPO dated Aug. 23, 2017 in European Application No. 17153870.5.

* cited by examiner

*Primary Examiner* — Quoc Hoang
(74) *Attorney, Agent, or Firm* — F. Chau & Associates, LLC

(57) ABSTRACT

A display apparatus includes a substrate. A display unit is disposed on the substrate and includes a display region and a non-display region. At least one light-emitting device is disposed in the display region. First and second power supply lines, configured to supply driving power to the at least one light-emitting device, and a pad unit, are disposed in the non-display region. The first power supply line includes a first fan-out wire portion electrically connected to the pad unit, and a first extension portion electrically connected to the first fan-out wire portion. The second power supply line includes a second fan-out wire portion electrically connected to the pad unit, and a second extension portion electrically connected to the second fan-out wire portion. The first extension portion has a width W1 and the second extension portion has a width W2. The width W1 is greater than the width W2.

42 Claims, 9 Drawing Sheets

(51) Int. Cl.
*G09G 3/3266* (2016.01)
*G09G 3/3291* (2016.01)
*G09G 3/3258* (2016.01)
*H01L 51/00* (2006.01)

DISPLAY APPARATUS

CROSS-REFERENCE TO RELATED APPLICATION

This application claims priority under 35 U.S.C. § 119 to Korean Patent Application No. 10-2016-0039329, filed on Mar. 31, 2016, in the Korean Intellectual Property Office, the disclosure of which is incorporated by reference herein in its entirety.

TECHNICAL FIELD

Exemplary embodiments of the present invention relate to a display apparatus.

DISCUSSION OF THE RELATED ART

Recently, the market for display devices has expanded. Accordingly, flat panel displays (FPDs), such as liquid crystal displays (LCDs), organic light-emitting diode (OLED) displays, and plasma display panels (PDPs), are becoming widely used.

However, the FDPs and other display devices experience image quality reduction due to the arrangement of the wires included therein.

SUMMARY

According to an exemplary embodiment of the present invention, a display apparatus reduces a red, green and blue (RGB) crosstalk phenomenon by reducing the resistance (R) value of a power supply line included in the display apparatus.

According to an exemplary embodiment of the present invention, a display apparatus includes a substrate. A display unit is disposed on the substrate, the display unit including a display region and a non-display region disposed around the display region. The display unit includes at least one light-emitting device disposed in the display region, a first power supply line and a second power supply line configured to supply driving power to the at least one light-emitting device and a pad unit disposed at a side of the display region. The first power supply line includes a first fan-out wire portion electrically connected to the pad unit, and a first extension portion electrically connected to the first fan-out wire portion in the non-display region. The second power supply line includes a second fan-out wire portion electrically connected to the pad unit, and a second extension portion electrically connected to the second fan-out wire portion in the non-display region. The first extension portion has a width W1 and the second extension portion has a width W2. The width W1 is greater than the width W2.

According to an exemplary embodiment of the present invention, a display apparatus includes a substrate including a display region and a non-display region. At least one light-emitting device is electrically connected to the thin film transistor. A power supply line is disposed on the substrate and is configured to supply driving power to the at least one light-emitting device. A pad unit is disposed on the substrate in the non-display region. The first power supply line includes a first fan-out wire portion connected to the pad unit, and a first extension portion connected to the first fan-out wire portion. The second power supply line includes a second fan-out wire portion connected to the pad unit, and a second extension portion connected to the second fan-out wire portion. The first extension portion has a width W1 and the second extension portion has a width W2. The width W1 is greater than the width W2.

According to an exemplary embodiment of the present invention, a display apparatus includes a substrate. A display unit is disposed on the substrate, the display unit including a display region and a non-display region disposed around the display region. The display unit includes a first light-emitting device disposed in the display region, a first power supply line and a second power supply line configured to supply driving power to the first light-emitting device and a pad unit disposed in the non-display region. The first power supply line includes, in the non-display region, a pair of first fan-out wire portions electrically connected to the pad unit, a pair of first extension portions, each electrically connected to each of the pair of first fan-out wire portions, respectively, and a first body portion connected to each of the pair of first extension portions. The second power supply line includes, in the non-display region, a pair of second fan-out wire portions electrically connected to the pad unit, a pair of second extension portions, each electrically connected to each of the pair of second fan-out wire portions, respectively, and a second body portion connected each of the pair of second extension portions. Each of the pair of second extension portions is disposed on opposite sides of the pair of the first extension portions. One of the pair of first extension portion has a width W1 and one of the pair of second extension portion has a width W2. The width W1 is greater than the width W2.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
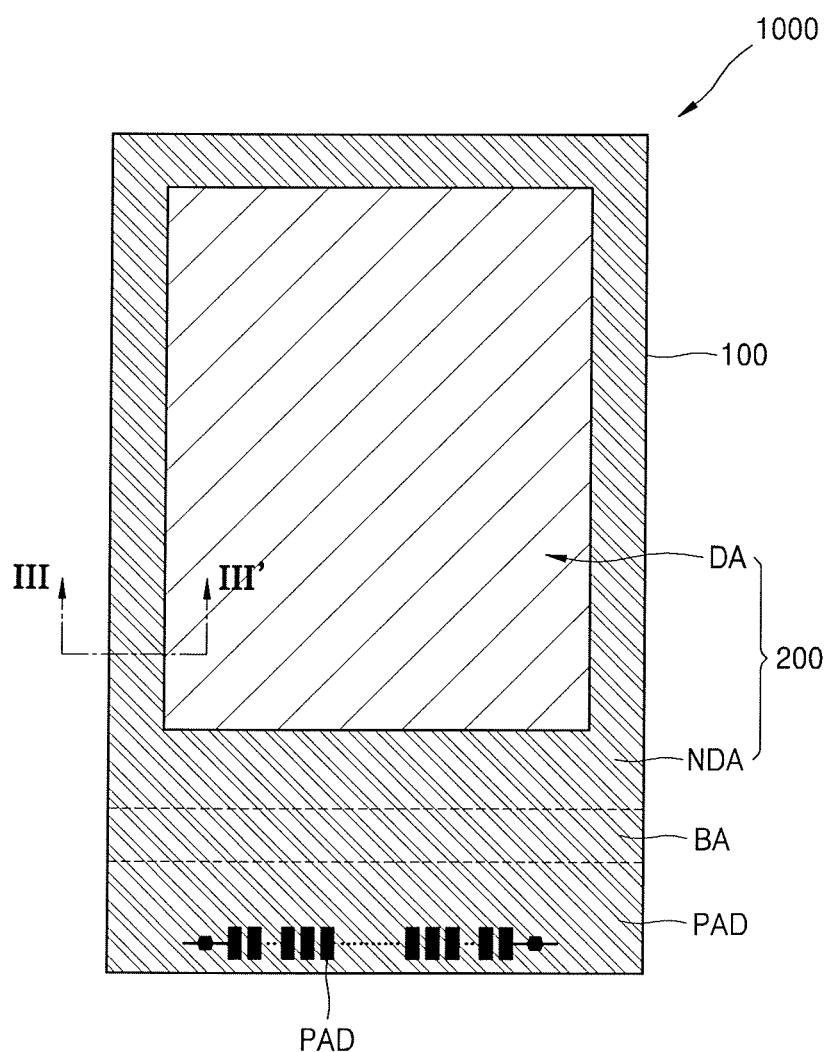
FIG. 1 is a plan view of a display apparatus, according to an exemplary embodiment of the present invention.

Exemplary embodiments of the present invention will be described more fully with reference to the accompanying drawings. The present invention may, however, be embodied in many different forms and should not be construed as limited to the embodiments set forth herein.

Like reference numerals may refer to like elements throughout the specification. Duplicate description of elements already described may be omitted for brevity.

As used herein, the singular forms "a", "an" and "the" may encompass the plural forms as well, unless the context clearly indicates otherwise.

It will be understood that when a layer, region, or component is referred to as being "formed on" another layer, region, or component, it can be directly formed on the other layer, region, or component, or intervening layers, regions, or components may be disposed therebetween.

Sizes of elements in the drawings may be exaggerated for convenience of explanation.

When an exemplary embodiment of the present invention may be implemented in more than one way, a process order may be performed differently from a described order. For example, two consecutively described processes may be performed substantially at the same time or performed in an order opposite to the described order. In the specification and drawings, X-talk and crosstalk may be used interchangeably.

Figure 2:
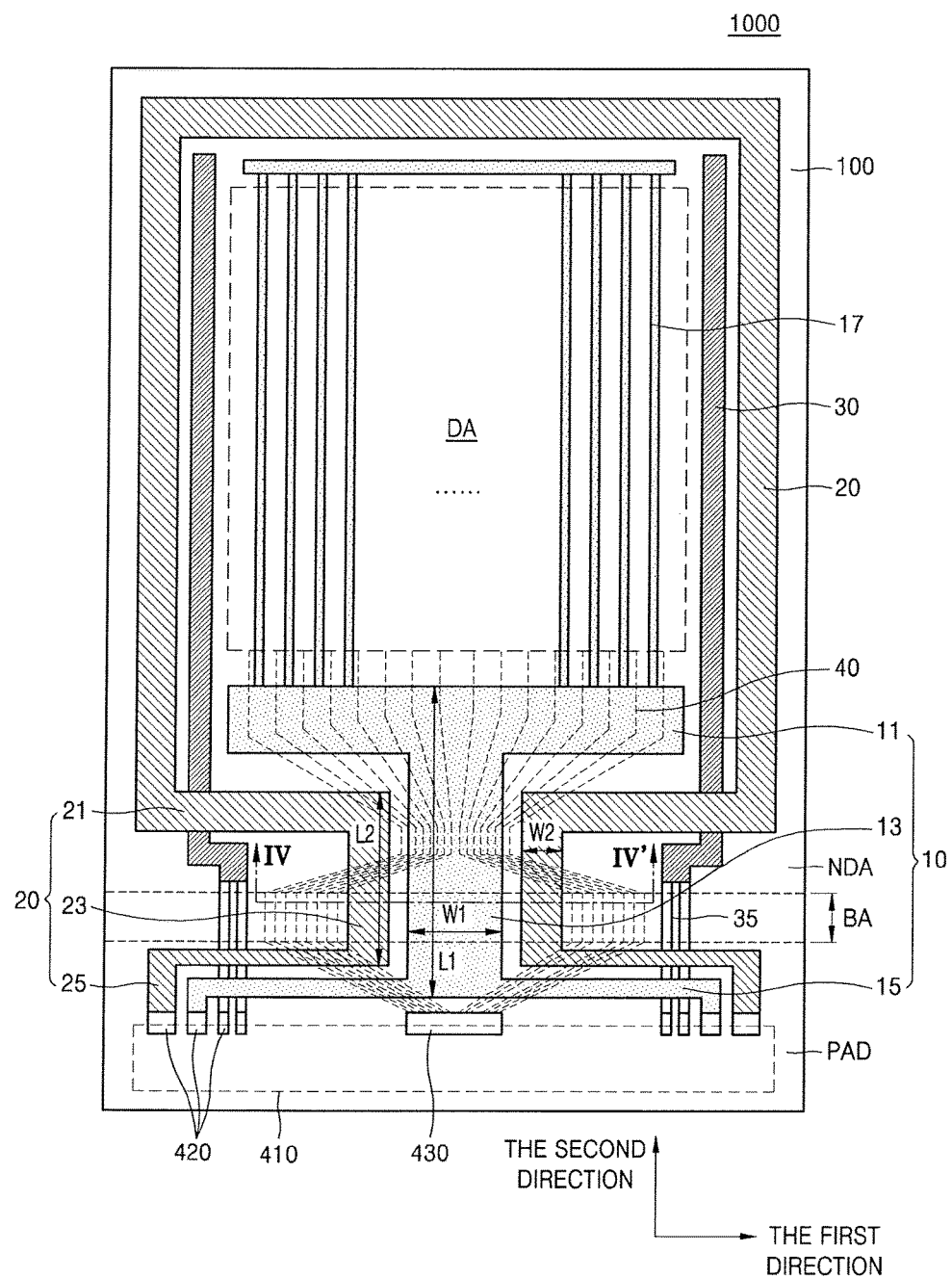
FIG. 2 is a plan view of power supply lines and a pad unit of the display apparatus of FIG. 1, according to an exemplary embodiment of the present invention.
Figure 3:
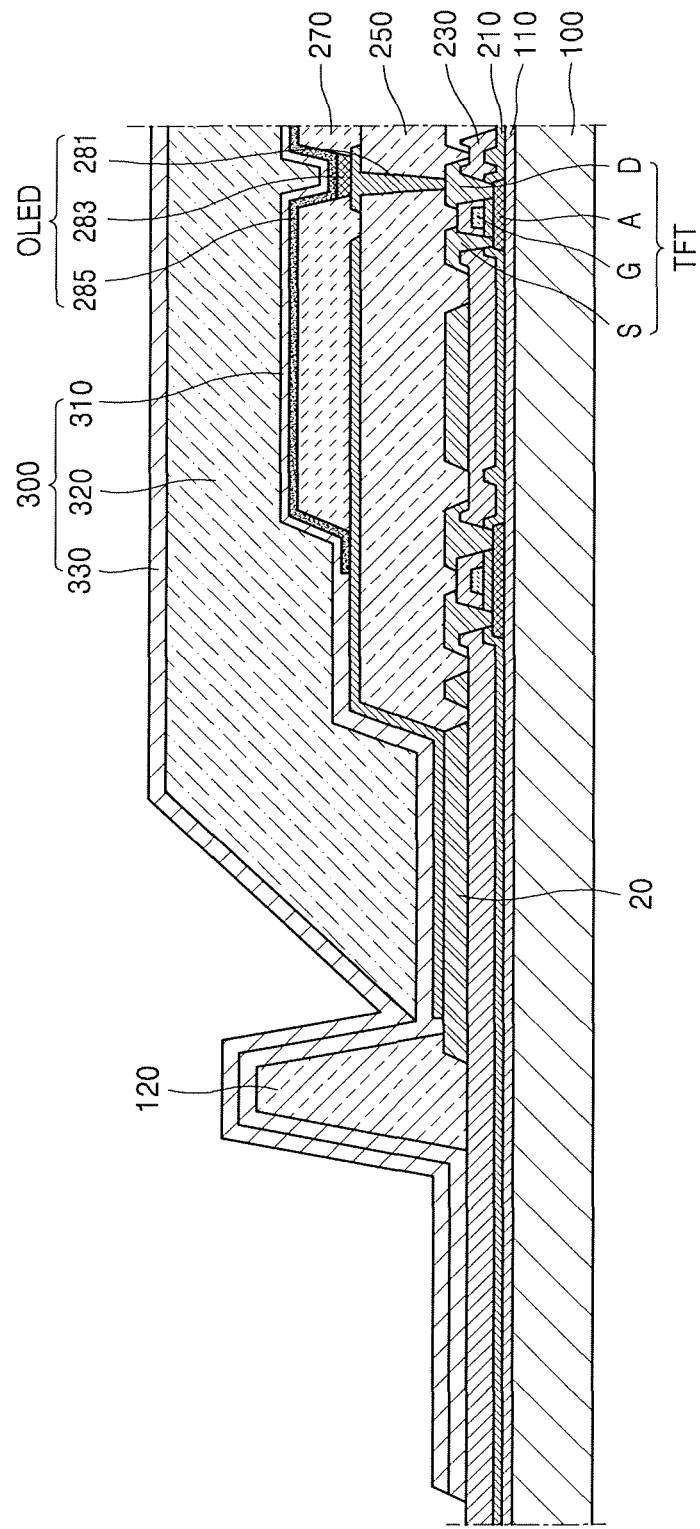
FIG. 3 is a cross-sectional view taken along line III-III' of FIG. 1, according to an exemplary embodiment of the present invention.

FIG. 1 is a plan view of a display apparatus 1000, according to an exemplary embodiment of the present invention. FIG. 2 is a plan view of power supply lines and a pad unit of the display apparatus 1000 of FIG. 1, according to an exemplary embodiment of the present invention. FIG. 3 is a cross-sectional view taken along line III-III' of FIG. 1, according to an exemplary embodiment of the present invention. The display apparatus 1000 will now be described in detail with reference to FIGS. 1-3.

Referring to FIGS. 1-3, the display apparatus 1000 may include a substrate 100, a display unit 200 on the substrate 100, and an encapsulation unit 300 encapsulating the display unit 200.

The substrate 100 may include various materials. For example, the substrate 100 may include a transparent glass material containing $SiO_2$ as a main component. However, the materials included in the substrate 100 are not limited thereto, and the substrate 100 may include a transparent plastic material. The plastic material may be an organic material selected from polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP), which are insulating materials.

For a bottom-emission display apparatus that displays an image toward the substrate 100, the substrate 100 needs to include a transparent material. However, for a top-emission display apparatus that displays an image away from the substrate 100, the substrate 100 does not need to include a transparent material. In this case, the substrate 100 may include, for example, a metal. The metal included in the substrate 100 may include at least one metal selected from the group consisting of iron (Fe), chrome (Cr), manganese (Mn), nickel (Ni), titanium (Ti), molybdenum (Mo), stainless steel (SUS), an Invar alloy, an Inconel alloy, and a Kovar alloy. However, the substrate 100 is not limited thereto.

The display unit 200 may be formed on the substrate 100. The display unit 200 may include a display region DA, that displays an image that a user may perceive, and a non-display region NDA, disposed around the display region DA. In addition, the display unit 200 may include the pad unit PAD.

The non-display region NDA may include a bending region BA that may be flexibly bent or folded, and the pad unit PAD. The pad unit PAD may be disposed on a side of the display region DA to transmit an electrical signal from a power supply or a signal generation device to the display region DA.

The display unit 200 may include at least one light-emitting device and a power supply line. The light-emitting device may include, but is not limited to, a liquid crystal display (LCD), an organic light-emitting diode (OLED), and the like. However, for convenience of explanation, only a case where the light-emitting device included in the display unit 200 is an OLED will be described below.

An OLED may be disposed in the display region DA of the display unit 200, and a power supply line may be disposed in the non-display region NDA.

The display unit 200 will now be described in more detail with reference to FIG. 3.

Referring to FIG. 3, a buffer layer 110 may be formed on the substrate 100. The buffer layer 110 may planarize an upper surface of the substrate 100 and block foreign matter or moisture from entering from the substrate 100. For example, the buffer layer 110 may include an inorganic material (such as silicon oxide, silicon nitride, silicon oxynitride, aluminum oxide, aluminum nitride, titanium oxide, and/or titanium nitride) or an organic material (such as polyimide, polyester, and/or acryl), or may be formed as stacks of these materials. The buffer layer 110 is formed on the display region DA and may extend on the non-display region NDA.

The shape of the display region DA may be, for example, rectangular. The display region DA may include a thin film transistor (TFT) and an OLED electrically connected to the TFT.

The TFT may include an active layer A, a gate electrode G, a source electrode S, and a drain electrode D.

A case where the TFT is of a top gate type, in which the active layer A, the gate electrode G, the source electrode S, and the drain electrode D are sequentially formed in the stated order, will be described below. However, the present invention is not limited thereto, and various types of TFTs, such as a bottom gate type TFT, may be employed in the display apparatus 1000.

The active layer A may be formed on the buffer layer 110. The active layer A includes a semiconductor material. For example, the active layer A may include amorphous silicon or polycrystalline silicon. However, the present invention is not limited thereto, and the active layer A may include various materials. According to an exemplary embodiment of the present invention, the active layer A may include an organic semiconductor material, or the like.

According to an exemplary embodiment of the present invention, the active layer A may include an oxide semiconductor material. For example, the active layer A may include an oxide of a material selected from Group 12, 13, and 14 metal elements (e.g., zinc (Zn), indium (In), gallium (Ga), stannum (Sn), cadmium (Cd), and germanium (Ge)), and/or a combination thereof.

After the active layer A is formed, a gate insulating layer 210 may be formed on the entire surface of the substrate 100, such that the gate insulating layer 210 covers the active layer A. The gate insulating layer 210 may include an inorganic material, such as silicon oxide or silicon nitride. The gate insulating layer 210 may have a multi-layer structure or a single-layer structure. The gate insulating layer 210 insulates the active layer A from the gate electrode G. The gate insulating layer 210 may be formed not only in the display region DA, but also in a portion of the non-display region NDA.

After the gate insulating layer 210 is formed, the gate electrode G may be formed on the gate insulating layer 210. The gate electrode G may be formed using photolithography and etching. The gate electrode G may be connected to a gate line. The gate line may apply ON/OFF signals to the TFT.

The gate electrode G may include a low resistance metal material. For example, the gate electrode G may include at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu), in a single or multi-layered structure. The single or multi-layered structure of the gate electrode G may take into account adhesion to an adjacent layer, surface smoothness of a layer stacked on the gate electrode G, and processing.

An interlayer insulating layer 230 may be formed on the gate electrode G. The interlayer insulating layer 230 insulates the source electrode S and the drain electrode D from the gate electrode G. The interlayer insulating layer 230 may be formed not only in the display region DA, but also in a portion of the non-display region NDA.

The interlayer insulating layer 230 may include an inorganic material in a multi-layer structure or a single-layer structure. The inorganic material may be, for example, a metal oxide or a metal nitride. For example, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), and/or the like.

The source electrode S and the drain electrode D of the TFT may be disposed on the interlayer insulating layer 230. The source electrode S and the drain electrode D may each include at least one selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), in a single-layered or a multi-layered structure. The source electrode S and the drain electrode D contact the active layer A.

Referring to FIG. 3, a via layer 250 may be formed over the entire surface of the substrate 100 such that the via layer 250 covers the source electrode S and the drain electrode D. The via layer 250 may planarize different surface elevations caused by the TFT in the layers disposed between the via layer 250 and the substrate 100. The via layer 250 may prevent damage that may be caused to the OLED by the different surface elevations of the layers disposed between the via layer 250 and the substrate 100.

The via layer 250 may include an insulating material. The via layer 250 may include, for example, an inorganic material, an organic material, or an organic/inorganic compound, in a single-layered or in a multi-layered structure. The via layer 250 may be formed using various deposition methods. In an exemplary embodiment of the present invention, the via layer 250 may include at least one selected from the group consisting of polyacrylates resin, epoxy resin, phenolic resin, polyamides resin, polyimides resin, unsaturated polyesters resin, poly phenylenethers resin, poly phenylenesulfides resin, and benzocyclobutene (BCB).

Referring to FIG. 3, the OLED may be disposed on the via layer 250.

The OLED is electrically connected to the TFT. The OLED includes a first electrode 281, a second electrode 285 facing the first electrode 281, and an intermediate layer 283 between the first and second electrodes 281 and 285.

The first electrode 281 may be electrically connected to the drain electrode D, as shown in FIG. 3. However, the present invention is not limited thereto. For example, the first electrode 281 may be electrically connected to the source electrode S. The first electrode 281 may have various shapes. The first electrode 281 may be patterned to have, for example, an island shape.

The first electrode 281 may be formed on the via layer 250, and may be electrically connected to the TFT via a contact hole formed in the via layer 250.

The first electrode 281 may be, for example, a reflective electrode. When the first electrode 281 is reflective, the first electrode 281 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof. In addition, the reflective first electrode 281 may include a transparent or semitransparent electrode layer formed on the reflective layer. The transparent or semi-transparent electrode layer may include at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 285, disposed opposite to the first electrode 281, may be a transparent or semi-transparent electrode. The second electrode 285 may include a metal thin film that includes Li, Ca, LiF/Ca, LiF/Al, Al, Ag, Mg, and/or a combination thereof. The second electrode 285 may have a small work function. An auxiliary electrode layer or a bus electrode may include a transparent electrode material, such as ITO, IZO, ZnO, and/or $In_2O_3$. The auxiliary electrode layer or the bus electrode may be disposed on the metal thin film. Accordingly, the second electrode 285 may transmit light emitted by an organic emission layer included in the intermediate layer 283. For example, light emitted by the organic emission layer may travel directly toward the second electrode 285, or the light may be reflected by the first electrode 281, formed as a reflective electrode, and then travel toward the second electrode 285.

However, the display unit 200 is not limited to a top-emission type display unit. The display unit 200 may be a bottom-emission type display unit, in which light emitted by the organic emission layer is emitted toward the substrate 100. In this case, the first electrode 281 may be a transparent or semitransparent electrode, and the second electrode 285 may be a reflective electrode. In addition, the display unit 200 may be a dual emission type display unit that emits light in both directions. For example, the dual emission type display unit 200 may emit light toward the top surface and toward the bottom surface of the display unit 200.

A pixel defining layer 270 may be disposed on the first electrode 281. The pixel defining layer 270 may include an insulating material. The pixel defining layer 270 may include at least one organic insulating material selected from the group consisting of polyimide, polyamide (PA), acryl resin, BCB and phenolic resin. The pixel defining layer 270 may be formed by using a method such as spin coating. The pixel defining layer 270 exposes a portion of the first electrode 281. The intermediate layer 283, including the organic emission layer, may be positioned on the exposed portion of the first electrode 281. For example, the pixel defining layer 270 defines a pixel region of the OLED.

The organic emission layer included in the intermediate layer 283 may include a low molecular organic material or a high molecular organic material. The intermediate layer 283 may further include one or more functional layers, such as a hole transport layer (HTL), a hole injection layer (HIL), an electron transport layer (ETL), and an electron injection layer (EIL), in addition to the organic emission layer.

Figure 4:
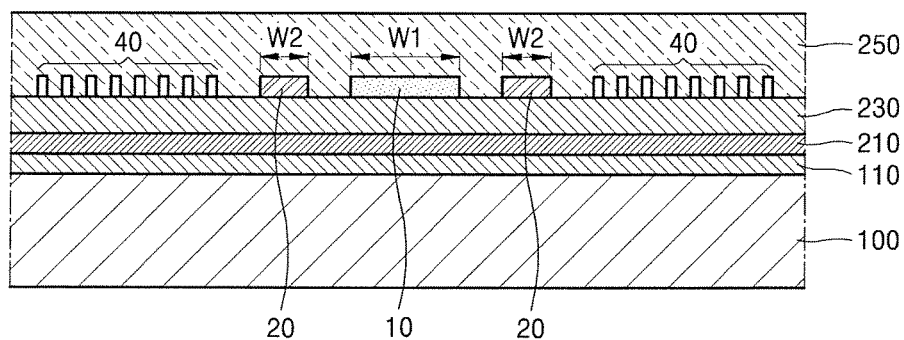
FIG. 4 is a cross-sectional view taken along line IV-IV' of FIG. 2, according to an exemplary embodiment of the present invention.

FIG. 4 is a cross-sectional view taken along line IV-IV' of FIG. 2, according to an exemplary embodiment of the present invention.

Power supply lines 10, 20, and 30, data fan-out wires 40, and the pad unit PAD, the pad unit PAD being disposed in the non-display region NDA (e.g., the pad unit PAD is disposed on a side of the display region DA), will now be described with reference to FIGS. 2 and 4.

The power supply lines 10, 20, and 30 may supply power to the OLED in the display region DA. The power supply line 10 may be referred to as a first power supply line 10. The power supply line 20 may be referred to as a second power supply line 20. The power supply line 30 may be referred to as a third power supply line 30.

According to an exemplary embodiment of the present invention, the first, second, and third power supply lines 10, 20, and 30 may include the same material used to form the source electrode S and/or the drain electrode D. For example, the first, second, and third power supply lines 10, 20, and 30 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

According to an exemplary embodiment of the present invention, the third power supply line 30 may include the same material used to form the gate electrode G. For example, the third power supply line 30 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

According to an exemplary embodiment of the present invention, a first voltage applied to the first power supply line 10 may be greater than a second voltage applied to the second power supply line 20. For example, the first power supply line 10 may be a driving voltage (ELVDD) line, and the second power supply line may be a common voltage (ELVSS) line.

The first voltage applied to the first power supply line 10, which is the ELVDD line, may be applied to the first electrode 281 of the OLED via the first power supply line 10 and a plurality of first dependent lines 17.

The second voltage applied to the second power supply line 20, which is the ELVSS line, may be applied to the second electrode 285 of the OLED via the second power supply line 20.

The first power supply line 10 may include a first body unit 11, a first extension unit 13, and first fan-out units 15. The first body unit 11 may also be referred to as a first body portion 11 throughout the specification. The first extension unit 13 may also be referred to as the first extension portion 13 throughout the specification. The first fan-out units 15 may also be referred to as the first fan-out portions 15 throughout the specification.

The first body unit 11 may face the side of the display region DA on which the pad unit PAD is disposed.

According to an exemplary embodiment of the present invention, the first body unit 11 may extend in a first direction of FIG. 2, and the first extension unit 13 may extend from the first body unit 11 in a second direction perpendicular to the first direction. The first extension unit 13 may be connected to the first fan-out units 15.

According to an exemplary embodiment of the present invention, the first extension unit 13 may have a single structure having a first width W1. Although the display apparatus 1000 is shown to include one first extension unit 13 in FIGS. 2 and 4, the number of first extension units 13 is not limited to one. For example, according to an exemplary embodiment of the present invention, at least two extension units 13 may be included in the display apparatus 1000, as described below.

Referring to FIG. 2, the first width W1 is a width of the first extension unit 13 along the first direction. The first extension unit 13 extends from the first body unit 11 in the second direction.

The first width W1 of the first extension unit 13 is measured along the first direction. The first width W1 of the first extension unit 13 may have different values (e.g., dimensions) depending on a design of the display apparatus 1000.

The first width W1 may be determined by using an optimized design which takes into account an arrangement of a plurality of lines, such as the first and second power supply lines 10 and 20, within a given area of the substrate 100, as shown in FIG. 2. Accordingly, the first extension unit 13 may have the first width W1 having an optimized dimension.

The first extension unit 13 may be formed so that the first width W1 ranges from about 100 μm to about 5 mm.

A first fan-out unit 15 may extend from the first extension unit 13, and the first power supply line 10 may be connected to the pad unit PAD through the first fan-out units 15. The first fan-out units 15 may be connected to a power pad 420 disposed in the pad unit PAD, and be electrically coupled to the power pad 420. The power pad 420 will be described below.

According to an exemplary embodiment of the present invention, the first power supply line 10 may further include the plurality of first dependent lines 17. The plurality of first dependent lines 17 extend from the first body unit 11, and are disposed on the display region DA as shown in FIG. 2. The plurality of first dependent lines 17 supply power to the OLED.

In FIG. 2, only some of the first dependent lines 17 are illustrated for clarity. In addition, the illustrated first dependent lines 17 extend in the second direction and are disposed on the display region DA. However, this arrangement is merely exemplary. The plurality of first dependent lines 17 may be formed in any shape. For example, the plurality of first dependent lines 17 may include some first dependent lines 17 extending in the first direction and some first dependent lines 17 extending in the second direction. In addition the plurality of first dependent lines 17 may have a mesh structure.

The second power supply line 20 may include a second body unit 21, second extension units 23, and second fan-out units 25. The second body unit 21 may also be referred to as the second body portion 21 throughout the specification. The second extension units 23 may also be referred to as the second extension portions 23 throughout the specification. The second fan-out units 25 may also be referred to as the second fan-out portions 25 throughout the specification.

The second body unit 21 may partially surround both ends of the first body unit 11. The second body unit 21 may partially surround sides of the display region DA, except for the side of the display region DA that faces the first body unit 11. For example, the second body unit 21 may wrap around the sides of the display region DA that don't face the first body unit 11.

The second body unit 21 may be disposed to at least partially face the first body unit 11. For example, a portion of the second body unit 21, which extends in the first direction, may face, or be disposed adjacent to, the first body unit 11. In addition, the second body unit 21 may be disposed to face both ends of the first body unit 11 along the first direction. Further, a portion of the first body unit 11 may be disposed between the second body unit 21 and the display area DA in the second direction.

The second extension units 23 may extend from the second body unit 21. The second extension units 23 may be respectively connected to the second fan-out units 25.

According to an exemplary embodiment of the present invention, the second extension units 23 may be disposed on both sides of the first extension unit 13. The second extension units 23 may be disposed, for example, on opposite sides of the first extension unit 13. For example, the second extension units 23 extend from the second body unit 21 in a direction parallel to the first extension unit 13.

Each of the two second extension units 23 may have a second width W2. Referring to FIG. 2, the second width W2 is a width of each second extension unit 23 along the first direction. For example, the second width W2 is measured along the first direction. The second extension units 23 may extend from the second body unit 21 in the second direction.

The second width W2 of each of the second extension units 23 may have different values (e.g., dimensions).

The second width W2 may be determined via an optimized design which takes into account the arrangement of a plurality of lines, such as the first and second power supply lines 10 and 20, within a given area of the substrate 100, as shown in FIG. 2.

For example, the second width W2 may be determined to be smaller than the first width W1. The second width W2 may be determined by taking into account, for example, the first width W1 of the first extension unit 13. Accordingly, the second extension units 23 may each have the second width W2 having an optimized value.

The second extension units 23 may be formed so that the second width W2 ranges from about 100 μn to about 5 mm.

Referring to FIGS. 2 and 4, in the display apparatus 1000, according to an exemplary embodiment of the present invention, the first width W1 of the first extension unit 13 is greater than the second width W2 of each second extension unit 23.

As the first width W1 of the first extension unit 13 increases, a resistance (R) value of the first power supply line 10 may decrease. As the R value of the first power supply line 10 decreases, the IR drop (e.g., voltage drop) decreases. Accordingly, red, green and blue (RGB) crosstalk of a display screen of the display apparatus 1000 decreases. Thus, a brightness deviation of the display screen decreases. Accordingly, the display screen may display an image having a uniform image quality.

The second fan-out units 25 may extend from the second extension units 23, respectively. The second power supply line 20 may be connected to the pad unit PAD through the second fan-out units 25. The second fan-out units 25 may be connected to the power pad 420 disposed in the pad unit PAD. The power pad 420 will be described below together with the pad unit PAD.

In the display apparatus 1000, according to an exemplary embodiment of the present invention, a ratio of a first length L1 with respect to the first width W1 of the first extension unit 13 may be less than 10.

The first length L1 is a length of a portion of the first power supply line 10. As shown in FIG. 2, the first length L1 may be a sum of a length of the first body unit 11 in the second direction, a length of the first extension unit 13 in the second direction, and a length of the first fan-out unit 15 in the second direction. For example, the first length L1 may be a straight-line distance, parallel to the second direction, from a point on the first body unit 11 closest to the display region DA, to a point on the first fan-out unit 15.

In the display apparatus 1000, according to an exemplary embodiment of the present invention, a ratio of a second length L2 with respect to the second width W2, of each respective second extension unit 23, may be less than 20.

The second length L2 is a length of a portion of the second power supply line 20. The second length L2 may be a distance including a length of the second body unit 21 in the second direction, a length, in the second direction, of a second extension unit 23 connected to the second body unit 21, and a length, in the second direction, of a second fan-out unit 25 connected to the second extension unit 23, as shown in FIG. 2.

The area of the substrate 100 in which the first extension unit 13 and the second extension unit 23 may be disposed is limited by the size of the substrate 100 and/or the elements disposed on the substrate 100. When the first width W1 of the first extension unit 13 is increased to reduce the R value of the first power supply line 10, the second width W2 of each second extension unit 23 becomes relatively small, since the area of the substrate 100 in which the first extension unit 13 and the second extension unit 23 is limited. When the second width W2 of each second extension unit 21 is reduced, the R value of the second power supply line 20 may be increased. Accordingly, as described above, the sizes of the first width W1 and the second width W2 may be restricted to have the above-described ratios with the first length L1 and the second length L2, respectively.

The first length L1 and the second length L2 might not be restricted, and may be different as shown in FIG. 2, as long as ratios between W1 and L1, and W2 and L2, respectively, are maintained as described above.

According to an exemplary embodiment of the present invention, when the first length L1 and the second length L2 are the same, the first extension unit 13 and the second extension units 23 may be formed such that the first width W1 is at least twice the second width W2.

According to an exemplary embodiment of the present invention, third power supply lines 30 may be disposed on the left and right sides of the display region DA, respectively.

The third power supply lines 30 may transmit an initializing voltage that initializes a driving TFT. The third power supply lines 30 may be, for example, initialization voltage lines that transmit an initialization voltage Vint to the driving TFT.

The third power supply lines 30 may each further include a third fan-out unit 35 electrically coupled to the power pad 420. According to an exemplary embodiment of the present invention, a pair of third fan-out units 35 is connected to the third power supply lines 30 on the left and right sides of the display region DA, respectively, as shown in FIG. 2. However, the shape of the third fan-out unit 35 is not limited to that shown in FIG. 2.

Referring to FIG. 2, in the display apparatus 1000, according to an exemplary embodiment of the present invention, the two second extension units 23 may be closer to the first extension unit 13 than the two third fan-out units 35 of the third power supply lines 30.

According to an exemplary embodiment of the present invention, the second extension units 23 may extend from the ends of the second body unit 21, respectively, and may be closer to the center of the substrate 100 than the two third fan-out units 35. For example, the two second extension units 23 may be closer to the center of the substrate 100 than to an outer edge of the substrate 100 in the first direction.

Although not shown in FIGS. 1-4, the display apparatus 1000, according to an exemplary embodiment of the present invention, may further include a VGH line and a VGL line that adjust the level of a voltage, in the non-display region NDA. According to an exemplary embodiment of the present invention, similar to the second body unit 21 of the second power supply line 20, the VGH line and the VGL line may surround both ends of the first body unit 11 of the first power supply line 10. For example, the VGH line and the VGL line may partially surround sides of the display region DA, except for the side of the display region DA that is parallel to the first body unit 11.

The display apparatus 1000, according to an exemplary embodiment of the present invention, may also include the data fan-out wires 40 disposed in the non-display region NDA.

The data fan-out wires 40 may be connected to a data pad 430 of the pad unit PAD, which will be described below, and may apply data voltages to data lines disposed in the display region DA.

According to an exemplary embodiment of the present invention, the data fan-out wires 40 may be disposed on a different layer than the layer on which the first and second power supply lines 10 and 20 are disposed, and may be electrically separated from the first and second power supply lines 10 and 20 by an insulating layer.

For example, although the first power supply line 10 and the second power supply line 20 may be formed on the same layer on which the source electrode S and the drain electrode D are formed, in this case the first power supply line 10 and the second power supply line 20 including the same material as the source electrode S and the drain electrode D, the data fan-out wires 40 may also be disposed on a different layer than that on which the first and second power supply lines 10 and 20 are disposed. In this case, the data fan-out wires 40 may be insulated from the first and second power supply lines 10 and 20 by the interlayer insulating layer 230. The data fan-out wires 40 may be formed on the same layer on which the gate electrode G is formed and may include the same material as the gate electrode G.

The data fan-out wires 40 may include, for example, at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

In FIG. 2, the first and second power supply lines 10 and 20 are illustrated by solid lines, and the data fan-out wires 40 are illustrated by dashed lines. This means that the first and second power supply lines 10 and 20 are disposed on a different layer than the layer on which the data fan-out wires 40 are disposed.

However, as shown in FIG. 4, the data fan-out wires 40 may be formed on the same layer as the first and second power supply lines 10 and 20 are formed.

Since a flexible metal needs to be used to prevent cracking of the wires in the bending region BA, the data fan-out wires 40 may be formed on the same layer on which the first and second power supply lines 10 and 20 are formed, using the same material as the source electrode S and the drain electrode D. In addition, the data fan-out wires 40 may be parallel to the second direction in order to reduce the R value of the wires.

In the bending region BA, the data fan-out wires 40 may be formed on the same layer on which the first and second power supply lines 10 and 20 are formed. In addition, the data fan-out wires 40 and may be disposed between the second and third power supply lines 20 and 30 to not overlap with the first, second, and third power supply lines 10, 20, and 30 in the bending region BA.

As described above, a portion of the data fan-out wires 40, disposed in the bending region BA, may be disposed on a different layer than other portions of the data fan-out wires 40, disposed in a region of the substrate 100 other than the bending region BA. The other portions of the data fan-out wires 40 disposed in the region of the substrate 100 other than the bending region BA, and the portion of the data fan-out wires 40 disposed in the bending region BA, may be electrically connected to each other via contact holes formed in the interlayer insulating layer 230.

The pad unit PAD, included in the display unit 200, will now be described in detail with reference to FIG. 2.

The pad unit PAD may include a driver integrated circuit (IC) 410, the power pad 420 connecting the driver IC 410 to a pixel circuit, and the data pad 430. The pad unit PAD may include at least a portion of the first power supply line 10, at least a portion of the second power supply line 20, at least a portion of the third power supply line 30, and at least a portion of the data fan-out wires 40.

The driver IC 410 may include a data driving unit for supplying a data signal to the display unit 200, and may further include various functional units necessary for driving the pixel circuit. The driver IC 410 may be mounted as a chip on glass (COG) type on the substrate 100. A plurality of coupling terminals, electrically coupled to the power pad 420 and the data pad 430, may be included on a side of the driver IC 410. Conductive balls may be disposed between the power pad 420 and the coupling terminal, and between the data pad 430 and the coupling terminal. In addition, an adhesive material may be disposed between the power pad 420 and the coupling terminal, and between the data pad 430 and the coupling terminal. The adhesive material may bond each of the power pad 420 and the data pad 430 to the coupling terminal. The adhesive material may be, for example, an anisotropic conductive film, a self-organizing conductive film, or the like.

The power pad 420 and the data pad 430 may be formed on the substrate 100, and the coupling terminal of the driver IC 410 is electrically coupled to the power pad 420 and the data pad 430.

A first portion, for example, a central portion, of the power pad 420 may be electrically coupled to the first fan-out units 15 of the first power supply line 10. A second portion of the power pad 420 may be electrically coupled to the second fan-out units 25 of the second power supply lines 20. For example, the first fan-out units 15 and the second fan-out units 25 may connect the power pad 420 to the pixel circuit.

The power pad 420 may be disposed on a different layer than the layer on which the first and second fan-out units 15 and 25 are formed. Alternatively, the power pad 420 may extend from the first and second fan-out units 15 and 25, and the power pad 420 may be disposed on the same layer as the first and second fan-out units 15 and 25.

According to an exemplary embodiment of the present invention, when the power pad 420 is disposed on a different layer than the layer on which the first and second fan-out units 15 and 25 are formed, the power pad 420 may be electrically coupled to the first and second fan-out units 15 and 25 through contact holes formed in an insulating layer between the power pad 420 and the first and second fan-out units 15 and 25. For example, the insulating layer may be disposed between the power pad 420 and the first and second fan-out units 15 and 25, and the contact holes may be formed in the insulating layer.

In the display apparatus 1000, according to an exemplary embodiment of the present invention, as shown in FIG. 2, the power pad 420 may be disposed on an edge of the pad unit PAD in the first direction. However, the location of the power pad 420 is not limited thereto, and the first fan-out units 15 and the second fan-out units 25 are electrically connected to the power pad 420 regardless of the location of the power pad 420.

The data pad 430 may be electrically coupled to the data fan-out wires 40. The data pad 430 may be disposed on a different layer than the layer on which the data fan-out wires 40 are disposed. Alternatively, the data pad 430 may extend from the data fan-out wires 40, and the data pad 430 may be disposed on the same layer as the data fan-out wires 40.

According to an exemplary embodiment of the present invention, when the data pad 430 is disposed on a different layer than the layer on which the data fan-out wires 40 are disposed, contact holes may be formed in an insulating layer between the data pad 430 and the data fan-out wires 40. In this case, the data pad 430 may be electrically coupled to the data fan-out wires 40 through the contact holes.

In the display apparatus 1000, according to an exemplary embodiment of the present invention, as shown in FIG. 2, the data pad 430 may be disposed on a center portion of the pad unit PAD in the first direction. However, the location of the data pad 430 is not limited thereto, and the data fan-out wires 40 are connected to the data pad 430 regardless of the location of the data pad 430.

According to an exemplary embodiment of the present invention, each of the power pad 420 and the data pad 430 may be formed in a single layer or in a plurality of layers including at least one of molybdenum (Mo), aluminum (Al), copper (Cu), and titanium (Ti).

A dam unit 120 and the encapsulation unit 300 will now be described in detail with reference to FIG. 3.

According to an exemplary embodiment of the present invention, the display apparatus 1000 may further include the damp unit 120, formed in the non-display region NDA.

The dam unit 120 may surround at least a portion of the display region DA. According to an exemplary embodiment of the present invention, as shown in FIG. 3, at least a portion of the dam unit 120 may overlap and contact an outer edge of the second body unit 21 of the second power supply line 20. An inner edge of the second body unit 21 of the second power supply line 20 may overlap and contact the via layer 250.

When the encapsulation layer 300, which may encapsulate the display unit 200, includes an organic layer, the dam unit 120 may block an organic material used to form the organic layer from flowing toward the edge of the substrate 100. Accordingly, the dam unit 120 may prevent the formation of an edge tale of the organic layer.

The dam unit 120 may include the same material used to form the via layer 250 or the pixel defining layer 270. As described above, the via layer 250 and the pixel defining layer 270 may include an organic material. The organic material may have a higher bonding strength with a metal than the inorganic material used to form the gate insulating layer 210 and/or the interlayer insulating layer 230. Accordingly, since the dam unit 120 overlaps and contacts at least the outer edge of the second power supply line 20, the dam unit 120 may be stably formed with a high bonding strength.

Since the second power supply line 20 surrounds the display region DA, the dam unit 120 may surround the entire display region DA.

Although the dam unit 120 overlaps the outer edge of the second power supply line 20 in FIG. 3, the present invention is not limited thereto. The dam unit 120 may be formed only on the second power supply line 20 or may be formed to cover the second power supply line 20.

Although the dam unit 120 is illustrated as a single layer in FIG. 3, the present invention is not limited thereto. For example, the dam unit 120 may include at least two layers. When the dam unit 120 has a double-layer structure, a lower layer may include the same material used to form the via layer 250, and an upper layer may include the same material used to form the pixel defining layer 270. A plurality of dam units 120 may be disposed on the substrate 100. When the display apparatus 1000 includes a plurality of dam units 120, the heights of the dam units may increase in a direction toward the outer edges of the substrate 100.

The encapsulation unit 300 blocks external moisture and/or oxygen and encapsulates the display unit 200. The encapsulation unit 300 may include a single layer or a plurality of layers. Although FIG. 3 is an embodiment of the present invention and illustrates the encapsulation unit 300 including a plurality of layers, embodiments are not limited thereto, and the encapsulation unit 300 may include only one layer.

The encapsulation unit 300 may include at least one of an organic layer 320 and inorganic layers 310 and 330.

According to an exemplary embodiment of the present invention, the inorganic layers 310 and 330 may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The organic layer 320 may include polymethyl methacrylate (PMMA), PC, polystyrene (PS), acryl-based resin, epoxy-based resin, polyimide, and/or polyethylene.

Since the dam unit 120 blocks an organic material used to form the organic layer 320 from flowing toward the outer edges of the substrate 100 when the organic layer 320 is formed, the organic layer 320 is contained (e.g., disposed) inside of an area formed by the dam unit 120.

The inorganic layers 310 and 330 may have larger areas than the organic layer 320, and may cover the dam unit 120. The inorganic layers 310 and 330 may extend beyond the area formed by dam unit 120, and the inorganic layers 310 and 330 may contact each other outside of the area formed by the dam unit 120. At least one of the inorganic layers 310 and 330 may contact the gate insulating layer 210 or the interlayer insulating layer 230 outside of the area formed by the dam unit 120. Thus, the inorganic layers 310 and 330 may prevent infiltration of external moisture through the outer sides of the encapsulation unit 300. In addition, a bonding strength of the encapsulation unit 300 may increase.

According to an exemplary embodiment of the present invention, the encapsulation unit 300 may include a Low temperature Viscosity Transition (LVT) inorganic material. A viscosity transition temperature denotes a minimum temperature at which the LVT inorganic material becomes fluid. The viscosity transition temperature may be less than a denaturalization temperature of a material included in the OLED.

The LVT inorganic material may be, for example, a low liquid temperature (LLT) material of which a glass transition temperature is 200° C. or less. The LLT material may include, for example, at least one of tin fluorophosphates glass, chalcogenide glass, tellurite glass, borate glass, and phosphate glass.

For example, the tin fluorophosphates glass may include, but is not limited to, Sn of 20-80% by weight, phosphorus (P) of 2-20% by weight, oxygen (O) of 3-20% by weight, and fluorine (F) of 10-36% by weight. The aforementioned glass materials may further include tungsten (W). When the tungsten (W) is added to the glass material, a more stable and uniform glass is produced. Thus, the encapsulation unit 300 may have an increased chemical durability.

The LVT inorganic material may include tin (Sn) oxide (for example, SnO or $SnO_2$. For example, when the LVT inorganic material includes SnO, the SnO content may be 20% by weight to 100% by weight.

The LVT inorganic material including tin (Sn) oxide may further include, but is not limited to, at least one of phosphorus (P) oxide (for example, $P_2O_5$), boron (B) phosphate ($BPO_4$), tin (Sn) fluoride (for example, $SnF_2$, niobium oxide (for example, NbO), and tungsten (W) oxide (for example, $WO_3$).

For example, the LVT inorganic material may include, but is not limited to, SnO; SnO and $P_2O_5$; SnO and $BPO_4$; SnO, $SnF_2$ and $P_2O_5$; SnO, $SnF_2$, $P_2O_5$ and NbO; or SnO, $SnF_2$, $P_2O_5$ and $WO_3$.

The LVT inorganic material may have, but is not limited to, any of the following compositions:

1. SnO 100% by weight;
2. SnO 80% by weight and $P_2O_5$ 20% by weight;
3. SnO 90% by weight and $BPO_4$ 10% by weight;
4. SnO 20-50% by weight, $SnF_2$ 30-60% by weight and $P_2O_5$ 10-30% by weight, where a sum of the weights of SnO, $SnF_2$, and $P_2O_5$ is 100%;
5. SnO 20-50% by weight, $SnF_2$ 30-60% by weight, $P_2O_5$ 10-30% by weight and NbO 1-5% by weight, where a sum of the weights of SnO, $SnF_2$, $P_2O_5$ and NbO is 100%; or
6. SnO 20-50% by weight, $SnF_2$ 30-60% by weight, $P_2O_5$ 10-30% by weight and $WO_3$ 1-5% by weight, where a sum of the weights of SnO, $SnF_2$, $P_2O_5$ and $WO_3$ is 100%.

Since such an encapsulation unit 300 may include a glass material, even when the encapsulation layer 300 does not include a plurality of layers, the encapsulation layer 300 may prevent infiltration of external moisture and oxygen. For example, as an alternative to the description of the encapsulation layer described with the embodiment of FIG. 3, the encapsulation unit 300 may include a single glass layer including an LVT inorganic material.

According to an exemplary embodiment of the present invention, the encapsulation unit 300 may include, for example, at least one inorganic layer (e.g., the inorganic layers 310 and 330) and at least one organic layer (e.g., the organic layer 320), which are alternately stacked one on another. Although the encapsulation unit 300 of the display apparatus 1000, according to an exemplary embodiment of the present invention, includes the two inorganic layers 310 and 330 and the single organic layer 320 alternating with each other, as shown in FIG. 3, the encapsulation unit 300 may further include a plurality of additional inorganic layers and a plurality of additional organic layers that are alternately stacked on one another. The number of organic and inorganic layers that can be alternatively stacked on each other is not limited.

According to an exemplary embodiment of the present invention, the encapsulation unit 300 may further include an LVT inorganic material layer.

The organic layer 320 may planarize different surface elevations caused by the pixel defining layer 270, and may reduce a stress generated on the inorganic layers 310 and 330. According to an exemplary embodiment of the present invention, the organic layer 320 may include PMMA, PC, PS, acryl-based resin, epoxy-based resin, polyimide, and/or polyethylene.

According to an exemplary embodiment of the present invention, the organic layer 320 may include silicon oxide including carbon and oxygen (hereinafter, referred to as SiOCH). For example, the organic layer 320 may include a material having a composition formula of $SiO_xC_yH_z$.

When the organic layer 320 includes SiOCH, the organic layer 320 may be formed by forming a precursor film on the inorganic layer 310 using a plasma enhanced chemical vapor deposition (PECVD) process. This may include using a raw material gas (e.g., hexamethyldisiloxane) and a reaction gas (e.g., oxygen), and then plasma curing the precursor film. Thus, since the inorganic layers 310 and 330 and the organic layer 320 may be formed using the same method within the same chamber, a tack time during formation of the encapsulation unit 300 may be reduced.

According to an exemplary embodiment of the present invention, at least one of the inorganic layers 310 and 330 may include SiOCH. For example, at least one of the inorganic layers 310 and 330 may include a material having a composition formula of $SiO_x'C_y'H_z'$.

When the organic layer 320 and at least one of the inorganic layers 310 and 330 include SiOCH, a composition ratio of SiOCH used to form the at least one of the inorganic layers 310 and 330 may be different from that of the SiOCH used to form the organic layer 320. For example, since a film including SiOCH has a similar property to an inorganic layer, as an oxygen content ratio increases and a carbon content ratio decreases, the oxygen content of the SiOCH used to form at least one of the inorganic layers 310 and 330 may be higher than that of the SiOCH used to form the organic layer 320. In addition, the carbon content of the SiOCH used to form the at least one of the inorganic layers 310 and 330 may be less than that of the SiOCH used to form the organic layer 320.

The oxygen and carbon contents of SiOCH may be adjusted during production of SiOCH. For example, an SiOCH film may be formed using the PECVD process by using a raw material gas (e.g., hexamethyldisiloxane) and a reaction gas (e.g., oxygen). In this case, when a flow ratio of oxygen as a reaction gas is increased, the oxygen content of the SiOCH film may be increased and the carbon content thereof may be decreased.

Accordingly, when the organic layer 320 and at least one of the inorganic layers 310 and 330 include SiOCH, the organic layer 320 and the inorganic layers 310 and 330 may be consecutively formed within the same chamber by adjusting the flow of the reaction gas. Accordingly, the manufacturing efficiency of the encapsulation unit 300 is increased.

Figure 5:
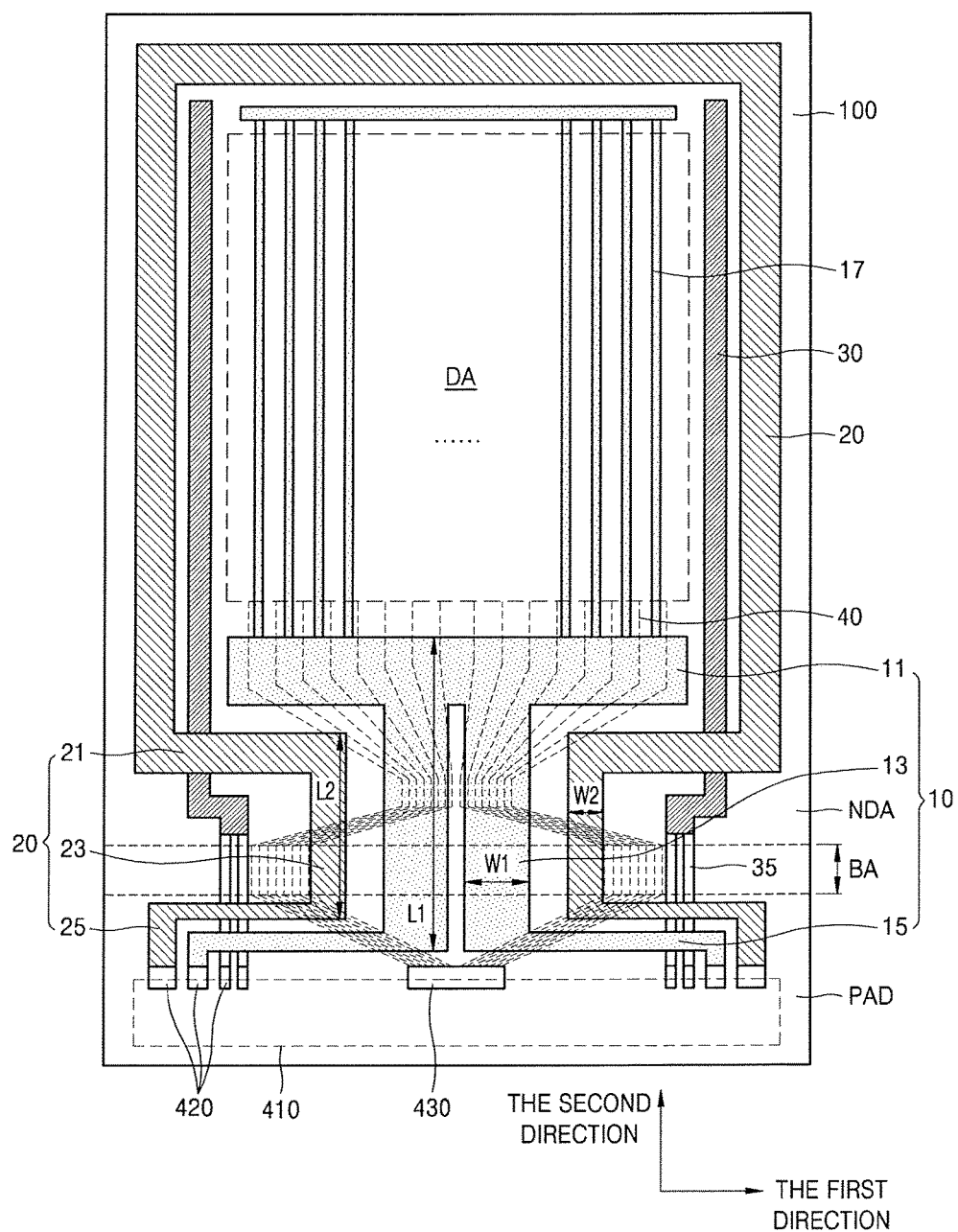
FIG. 5 is a plan view of power supply lines and a pad unit of a display apparatus, according to an exemplary embodiment of the present invention.

FIG. 5 is a plan view of power supply lines and a pad unit of a display apparatus 2000, according to an exemplary embodiment of the present invention. A repetitive description of elements already described with reference to FIGS. 1-3 may be omitted for brevity.

Referring to FIGS. 3 and 5, the display apparatus 2000, according to an exemplary embodiment of the present invention, may include a substrate 100 and a display unit 200. The display unit 200 may include a display region DA, and a non-display region NDA disposed around the display region DA.

The display unit 200 may include at least one OLED, the power supply lines 10, 20, and 30 supplying driving power to the OLED, and the pad unit PAD disposed at a side of the display region DA.

The power supply lines 10, 20, and 30 may supply power to the OLED in the display region DA. The power supply lines 10, 20, and 30 may include a first power supply line 10, a second power supply line 20, and a third power supply line 30.

A first voltage applied to the first power supply line 10 may be greater than a second voltage applied to the second power supply line 20. For example, the first power supply line 10 may be a driving voltage (ELVDD) line, and the second power supply line may be a common voltage (ELVSS) line.

The first voltage applied to the first power supply line 10 may be applied to the first electrode 281, and the second voltage applied to the second power supply line 20 may be applied to the second electrode 285. For example, the first power supply line 10 and the second power supply line 20 may be electrically connected to the first electrode 281 and the second electrode 285, respectively.

The first power supply line 10 may include a first body unit 11, a first extension unit 13, and first fan-out units 15.

The first body unit 11 may face the side of the display region DA on which the pad unit PAD is disposed. According to an exemplary embodiment of the present invention, the first body unit 11 may extend in the first direction, and the first extension unit 13 may extend from the first body unit 11 in the second direction perpendicular to the first direction.

In the display apparatus 2000, according to an exemplary embodiment of the present invention, the first extension unit 13 may include a pair of first extension units 13 extending from the first body unit 11. However, the number of first extension units 13 is not limited to two, as long as the first extension units 13 are able to electrically connect the first power supply line 10 to the pad unit PAD, and supply power to the display unit 200. For example, according to an exemplary embodiment of the present invention, the first extension unit 13 may include three or more first extension units 13.

The two first extension units 13 of FIG. 5 may each have a first width W1, and may be adjacent to each other. However, this arrangement is merely exemplary, and the arrangement of the two first extension units 13 is not limited thereto. According to an exemplary embodiment of the present invention, the first widths W1 of the two first extension unit 13 may be equal to each other.

According to an exemplary embodiment of the present invention, the first widths W1 of the two first extension units 13 may be different from each other.

A first fan-out unit 15 may extend from each of the first extension units 13, and the first power supply line 10 may be electrically connected to the pad unit PAD through the first fan-out units 15.

The second power supply line 20 may include a second body unit 21, second extension units 23, and second fan-out units 25.

The second body unit 21 may partially surround both ends of the first body unit 11. The second body unit 21 may partially surround sides of the display region DA, except for the side of the display region DA that faces the first body unit 11. For example, the second body unit 21 may wrap around the sides of the display region DA that don't face the first body unit 11.

The second extension units 23 may extend from the second body unit 21, and may be located on both sides of the pair of first extension units 13. For example, each of the second extensions units 23 of FIG. 5 may be disposed adjacent to one of the pair of first extension units 13.

For example, each of a pair of second extension units 23 may extend from the second body unit 21 in a direction, for example, parallel to the first extension units 13.

Each of the two second extension units 23 may have a second width W2. The second extension units 23 may be formed so that the second width W2 ranges from about 100 μm to about 5 mm.

Referring to FIG. 5, in the display apparatus 2000, according to an exemplary embodiment of the present invention, the first width W1 of each first extension unit 13 may be greater than the second width W2 of each of the second extension units 23.

As shown in FIG. 5, each of the two second extension units 23 may have the same second width W2.

According to an exemplary embodiment of the present invention, the second widths W2 of the two second extension units 23 may be different from each other.

Referring to FIG. 5, in the display apparatus 2000, according to an exemplary embodiment of the present invention, the first width W1 of each first extension unit 13 may be greater than the second width W2 of each second extension unit 23.

According to an exemplary embodiment of the present invention, the two first extension units 13 have widths W1 and the two second extension units 23 have widths W2, the width W1 being greater than the width W2.

As the first width W1 is formed to have a larger value, and thus the R resistance value of the first power supply line 10 decreases, occurrence of the IR drop (e.g., voltage drop) decreases. Accordingly, RGB crosstalk of a display screen of the display apparatus 2000 decreases. Accordingly, the display screen may display an image having a uniform image quality.

The second fan-out units 25 may extend from the second extension units 23, respectively. The second power supply line 20 may be connected to the pad unit PAD by the second fan-out units 25.

Referring to FIG. 5, in the display apparatus 2000, according to an exemplary embodiment of the present invention, the two second extension units 23 may be closer to the first extension units 13 than the two third fan-out units 35 of the third power supply lines 30. For example, the two first extension units 13 may be disposed between the two second extension units 23, and the two second extension units 23 may be disposed between the two third fan-out units 35.

According to an exemplary embodiment of the present invention, the second extension units 23 may extend from the ends of the second body unit 21, respectively, and may be closer to the center of the substrate 100 than the two third fan-out units 35. For example, the two second extension units 23 may be closer to the center of the substrate 100 than to an outer edge of the substrate 100 in the first direction.

The display unit 200 may further include data fan-out wires 40 that apply data voltages to data lines disposed in the display region DA.

The data fan-out wires 40 may be formed on the same layer on which the gate electrode G is formed, using the same material as the gate electrode G, in a region other than the bending region BA. In addition, the data fan-out wires 40 may be formed on the same layer on which the first and second power supply lines 10 and 20 are formed, using the same material as the source electrode S and the drain electrode D, in the bending region BA.

As described above, a portion of the data fan-out wires 40, disposed in the bending region BA, may be disposed on a different layer than other portions of the data fan-out wires 40, disposed in a region of the substrate 100 other than the bending region BA. The other portions of the data fan-out wires 40 disposed in the region of the substrate 100 other than the bending region BA, and the portion of the data fan-out wires 40 disposed in the bending region BA, may be electrically connected to each other via contact holes formed in the interlayer insulating layer 230.

In the bending region BA, the data fan-out wires 40 may be disposed between the second and third power supply lines 20 and 30 to not overlap with the first, second, and third power supply lines 10, 20, and 30.

Figure 6:
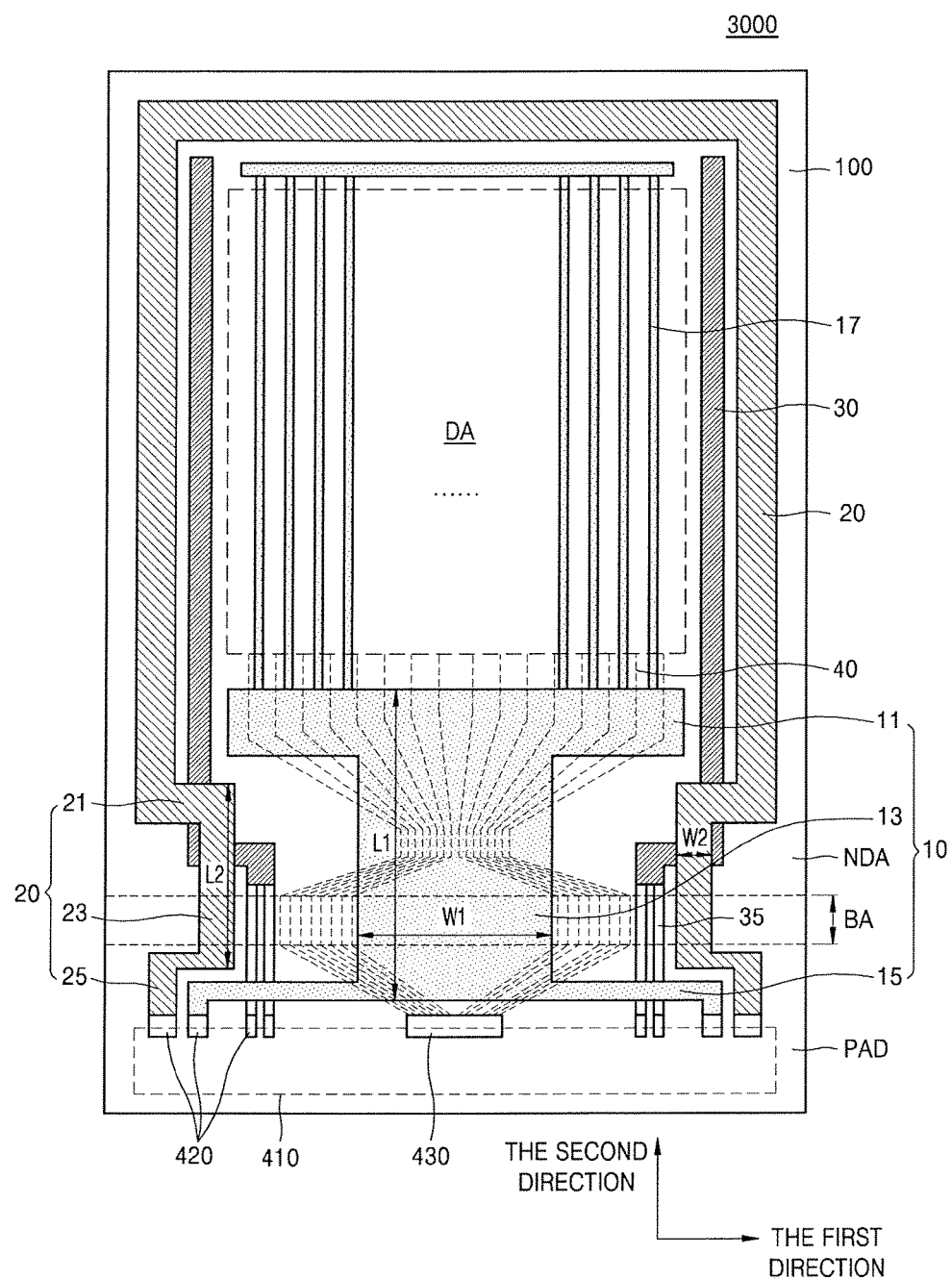
FIG. 6 is a plan view of a power supply line and a pad unit of a display apparatus, according to an exemplary embodiment of the present invention.

FIG. 6 is a plan view of a power supply line and a pad unit of a display apparatus 3000, according to an exemplary embodiment of the present invention. A repetitive description of elements already described with reference to FIGS. 1-3 may be omitted for brevity.

Referring to FIGS. 3 and 6, the display apparatus 3000, according to an exemplary embodiment of the present invention, may include a substrate 100 and a display unit 200. The display unit 200 includes a display region DA, and a non-display region NDA disposed around the display region DA.

The display unit 200 may include at least one OLED, power supply lines 10, 20, and 30 supplying driving power to the OLED, and a pad unit PAD disposed at a side of the display region DA.

The power supply lines 10, 20, and 30 may supply power to the OLED in the display region DA. The power supply lines 10, 20, and 30 may include a first power supply line 10, a second power supply line 20, and a third power supply line 30.

A first voltage applied to the first power supply line 10 may be greater than a second voltage applied to the second power supply line 20. For example, the first power supply line 10 may be a driving voltage (ELVDD) line, and the second power supply line may be a common voltage (ELVSS) line.

The first voltage applied to the first power supply line 10 may be applied to the first electrode 281, and the second voltage applied to the second power supply line 20 may be applied to the second electrode 285.

The first power supply line 10 may include a first body unit 11, a first extension unit 13, and first fan-out units 15.

The first body unit 11 may face the side of the display region DA on which the pad unit PAD is disposed. According to an exemplary embodiment of the present invention, the first body unit 11 may extend in the first direction, and the first extension unit 13 may extend from the first body unit 11 in the second direction perpendicular to the first direction. According to an exemplary embodiment of the present invention, the first extension unit 13 may have a single structure having a first width W1, and may be formed so that the first width W1 ranges from about 100 μm to about 5 mm.

A first fan-out unit 15 may extend from each of the first extension unit 13, and the first power supply line 10 may be electrically connected to the power pad 420 disposed in the pad unit PAD through the first fan-out units 15.

The second power supply line 20 may include a second body unit 21, second extension units 23, and second fan-out units 25.

The second body unit 21 may partially surround both ends of the first body unit 11. The second body unit 21 may partially surround sides of the display region DA, except for the side of the display region DA that faces the first body unit 11. For example, the second body unit 21 may wrap around the sides of the display region DA that don't face the first body unit 11.

The second extension units 23 may extend from the second body unit 21, and may be located on both sides of the pair of first extension units 13. For example, each of the second extensions units 23 of FIG. 6 may be disposed adjacent to the first extension unit 13.

For example, each of a pair of second extension units 23 may extend from the second body unit 21 in a direction, for example, parallel to the first extension units 13.

Each of the two second extension units 23 may have a second width W2. The second extension units 23 may be formed so that the second width W2 ranges from about 100 μm to about 5 mm.

Referring to FIG. 6, in the display apparatus 3000, according to an exemplary embodiment of the present invention, the first width W1 of the first extension unit 13 may be greater than the second width W2 of each second extension unit 23.

According to an exemplary embodiment of the present invention, as shown in FIG. 6, the two second extension units 23 may be closer to a respective outer edge of the substrate 100 than the two third fan-out units 35 of the third power supply lines 30. For example, the first extension unit 13 may be disposed between the two third fan-out units 35, and the two third fan-out units 35 may be disposed between the two second extension units 23.

For example, the second extension units 23 may extend from the ends of the second body unit 21, respectively, and may be disposed closer to the edge of the substrate 100 than to the center portion of the substrate 100 in the first direction.

Accordingly, an area where the first extension unit 13 may be formed is enlarged. Accordingly, the first extension unit 13 may have a first width W1 having a large value.

As the first width W1 of the first extension unit 13 increases, a resistance (R) value of the first power supply line 10 may decrease. As the R value of the first power supply line 10 decreases, the IR drop (e.g., voltage drop) decreases. Accordingly, RGB crosstalk of a display screen of the display apparatus 3000 decreases. Accordingly, the display screen may display an image having a uniform image quality.

In the display apparatus 3000, according to an exemplary embodiment of the present invention, since the two second extension units 23 are disposed closer to the edge of the substrate 100 than the third fan-out units 35, the first width W1 of the first extension unit 13 may have a large size. Accordingly the RGB crosstalk of the display screen of the may be reduced, and the image quality of the display screen may be increased.

The display unit 200 may further include data fan-out wires 40 that apply data voltages to data lines disposed in the display region DA.

The data fan-out wires 40 may be formed on the same layer on which the gate electrode G is formed, using the same material as the gate electrode G, in a region other than the bending region BA. In addition, the data fan-out wires 40 may be formed on the same layer on which the first and second power supply lines 10 and 20 are formed, using the same material as the source electrode S and the drain electrode D, in the bending region BA.

As described above, a portion of the data fan-out wires 40, disposed in the bending region BA, may be disposed on a different layer than other portions of the data fan-out wires 40, disposed in a region of the substrate 100 other than the bending region BA. The other portions of the data fan-out wires 40 disposed in the region of the substrate 100 other than the bending region BA, and the portion of the data fan-out wires 40 disposed in the bending region BA, may be electrically connected to each other via contact holes formed in the interlayer insulating layer 230.

In the bending region BA, the data fan-out wires 40 may be disposed between the first and third power supply lines 10 and 30 to not overlap with the first, second, and third power supply lines 10, 20, and 30.

Figure 7:
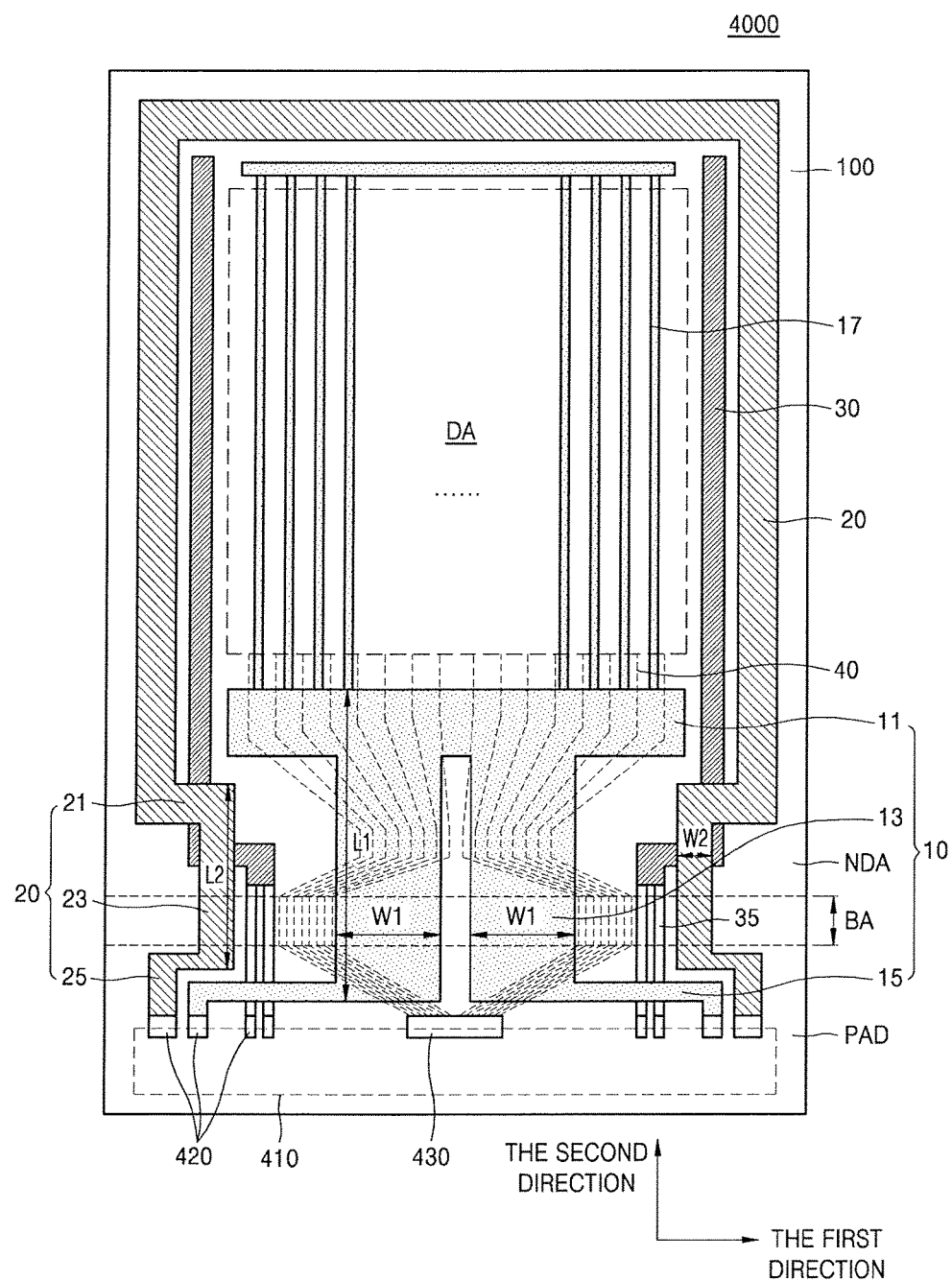
FIG. 7 is a plan view of a power supply line and a pad unit of a display apparatus, according to an exemplary embodiment of the present invention.

FIG. 7 is a plan view of a power supply line and a pad unit of a display apparatus 4000, according to an exemplary embodiment of the present invention. A repetitive description of elements already described with reference to FIGS. 1-3 may be omitted for brevity.

Referring to FIGS. 3 and 7, the display apparatus 4000, according to an exemplary embodiment of the present invention, may include a substrate 100 and a display unit 200. The display unit 200 includes a display region DA, and a non-display region NDA disposed around the display region DA.

The display unit 200 may include at least one OLED, power supply lines 10, 20, and 30 supplying driving power to the OLED, and a pad unit PAD disposed around one side of the display region DA.

The power supply lines 10, 20, and 30 may supply power to the OLED in the display region DA. The power supply lines 10, 20, and 30 may include a first power supply line 10, a second power supply line 20, and a third power supply line 30.

A first voltage applied to the first power supply line 10 may be greater than a second voltage applied to the second power supply line 20. For example, the first power supply line 10 may be a driving voltage (ELVDD) line, and the second power supply line may be a common voltage (ELVSS) line.

The first voltage applied to the first power supply line 10 may be applied to the first electrode 281, and the second voltage applied to the second power supply line 20 may be applied to the second electrode 285. For example, the first power supply line 10 and the second power supply line 20 may be electrically connected to the first electrode 281 and the second electrode 285, respectively.

The first power supply line 10 may include a first body unit 11, a first extension unit 13, and first fan-out units 15. In the display apparatus 4000, according to an exemplary embodiment of the present invention, the first extension unit 13 may include a pair of first extension units 13 extending from the first body unit 11. However, the number of first extension units 13 is not limited to two, as long as the first extension units 13 are able to electrically connect the first power supply line 10 to the pad unit PAD, and supply power to the display unit 200.

The two first extension units 13 may each have a first width W1, and may be adjacent to each other. However, this arrangement is merely exemplary, and the arrangement of the two first extension units 13 is not limited thereto.

According to an exemplary embodiment of the present invention, the first widths W1 of the two first extension units 13 may be different from each other.

A first fan-out unit 15 may extend from each of the first extension units 13, and the first power supply line 10 may be electrically connected to the power pad 420 disposed in the pad unit PAD through the first fan-out unit 15.

The second power supply line 20 may include a second body unit 21, second extension units 23, and second fan-out units 25.

The second body unit 21 may partially surround both ends of the first body unit 11. The second body unit 21 may partially surround sides of the display region DA, except for the side of the display region DA that faces the first body unit 11. For example, the second body unit 21 may wrap around the sides of the display region DA that don't face the first body unit 11.

The second extension units 23 may extend from the second body unit 21, and may be located on both sides of the pair of first extension units 13. For example, each of the second extensions units 23 of FIG. 7 may be disposed at a side of one of the pair of first extension units 13.

For example, each of a pair of second extension units 23 may extend from the second body unit 21 in a direction, for example, parallel to the first extension units 13.

Each of the two second extension units 23 may have a second width W2. The second extension units 23 may be formed so that the second width W2 ranges from about 100 μm to about 5 mm.

Referring to FIG. 7, in the display apparatus 4000, according to an exemplary embodiment of the present invention, the first width W1 of each first extension unit 13 may be greater than the second width W2 of each second extension unit 23.

As shown in FIG. 7, each of the two second extension units 23 may have the same second width W2.

According to an exemplary embodiment of the present invention, the second widths W2 of the two second extension units 23 may be different from each other.

Referring to FIG. 7, in the display apparatus 4000, according to an exemplary embodiment of the present invention, the first width W1 of each first extension unit 13 may be greater than the second width W2 of each second extension unit 23.

According to an exemplary embodiment of the present invention, the two first extension units 13 have widths W1 and the two second extension units 23 have widths W2, the width W1 being greater than the width W2.

According to an exemplary embodiment of the present invention, as shown in FIG. 7, the two second extension units 23 may be closer to an edge of the substrate 100 than the two third fan-out units 35 of the third power supply lines 30.

For example, the second extension units 23 may extend from the ends of the second body unit 21, respectively, and may be disposed closer to the edge of the substrate 100 than to the center portion of the substrate 100 in the first direction.

Accordingly, an area where the first extension unit 13 may be formed is enlarged. Accordingly, the first extension unit 13 may have a first width W1 having a large value.

As the first width W1 of the first extension unit 13 increases, a resistance (R) value of the first power supply line 10 may decrease. As the R value of the first power supply line 10 decreases, the IR drop (e.g., voltage drop) decreases. Accordingly, RGB crosstalk of a display screen of the display apparatus 3000 decreases. Accordingly, the display screen may display an image having a uniform image quality.

In the display apparatus 4000, according to an exemplary embodiment of the present invention, since the two second extension units 23 are disposed closer to the edge of the substrate 100 than the third fan-out units 35, the first widths W1 of the first extension units 13 may have large sizes. Accordingly the RGB crosstalk of the display screen of the may be reduced, and the image quality of the display screen may be increased.

The display unit 200 may further include data fan-out wires 40 that apply data voltages to data lines disposed in the display region DA.

The data fan-out wires 40 may be formed on the same layer on which the gate electrode G is formed, using the same material as the gate electrode G, in a region other than the bending region BA. In addition, the data fan-out wires 40 may be formed on the same layer on which the first and second power supply lines 10 and 20 are formed, using the same material as the source electrode S and the drain electrode D, in the bending region BA.

As described above, a portion of the data fan-out wires 40, disposed in the bending region BA, may be disposed on a different layer than other portions of the data fan-out wires 40, disposed in a region of the substrate 100 other than the bending region BA. The other portions of the data fan-out wires 40 disposed in the region of the substrate 100 other than the bending region BA, and the portion of the data fan-out wires 40 disposed in the bending region BA, may be electrically connected to each other via contact holes formed in the interlayer insulating layer 230.

In the bending region BA, the data fan-out wires 40 may be disposed between the first and third power supply lines 10 and 30 to not overlap with the first, second, and third power supply lines 10, 20, and 30.

Figure 8:
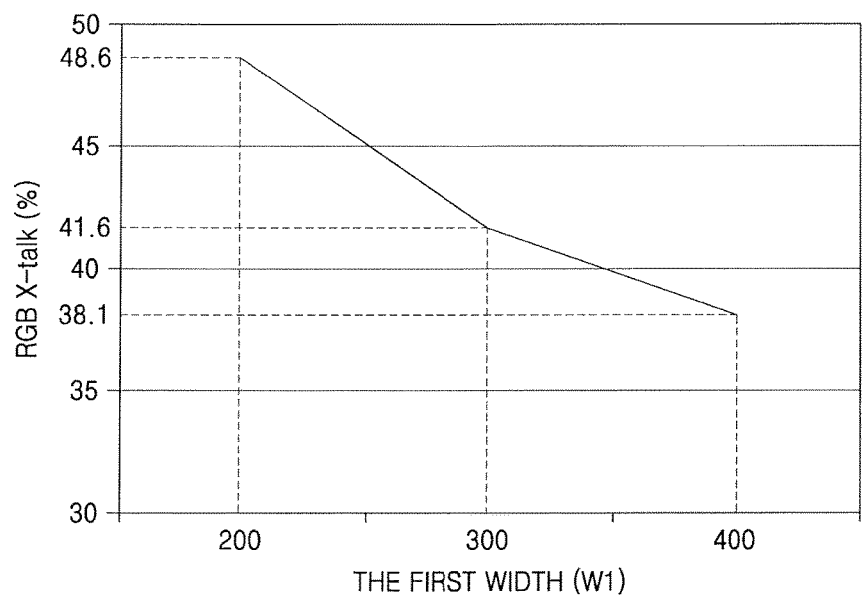
FIG. 8 is a graph of RGB X-talk (%) (e.g., crosstalk percent) versus a first width of a first extension unit.
Figure 9:
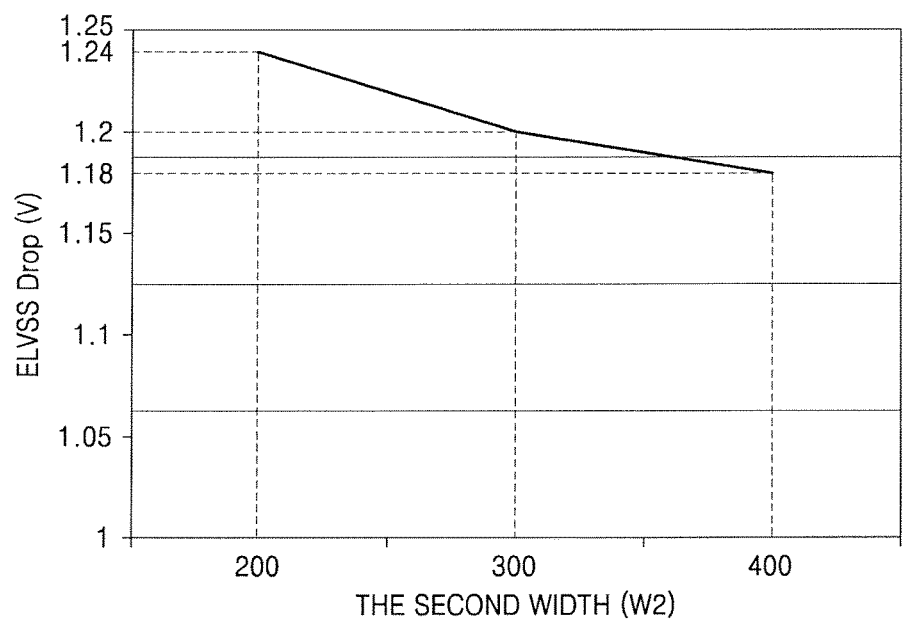
FIG. 9 is a graph of an ELVSS drop value (V) (e.g., ELVSS voltage drop) versus a second width of a second extension unit.

FIG. 8 is a graph of RGB X-talk (%) (e.g., crosstalk percent) versus a first width W1 of a first extension unit 11. FIG. 9 is a graph of an ELVSS drop value (V) (e.g., ELVSS voltage drop) versus a second width W2 of a second extension unit 23.

Referring to FIGS. 2 and 8, as the first width W1 of the first extension unit 13 increases, occurrence of RGB X-talk (%) decreases.

As shown in the graph of FIG. 7, as the first width W1 increases to 200 μm, 300 μm, and 400 μm, respectively, an RGB X-talk value decreases to 48.6%, 41.6%, and 38.1%.

Accordingly, when the first width W1 increases from 200 μm to 400 μm, a reduction of RGB X-talk is about 10.5%.

Referring to FIGS. 2 and 9, as the second width W2 of the second extension unit 23 increases, the ELVSS drop value (V) decreases. For example, as shown in the graph of FIG. 9, as the second width W2 increases to 200 μm, 300 μm, and 400 μm, respectively, the ELVSS drop value (V) decreases to 1.24, 1.20, and 1.18.

The ELVSS drop value (V) is a voltage (V) that is not available (e.g., dropped or lost) due to the (R) (e.g., the resistance) of wiring. Thus, when the ELVSS drop value (V) decreases, an available voltage (V) increases. Accordingly, power consumption of the display apparatus may be reduced. The power consumption may increase in proportion to a decrease in the ELVSS drop value (V).

Accordingly, when the second width W2 increases from 200 μm to 400 μm, a reduction ratio of power consumption according to a decrease in the ELVSS drop value (V) is about 4.8%.

The RGB X-talk problem is addressed when the first width W1 increases, and power consumption is reduced when the second width W2 increases. However, an area where the first extension unit 13 and the second extension unit 23 may be formed is restricted, and it is impossible to enlarge both the first width W1 and the second width W2.

Thus, a more efficient display apparatus may be obtained by comparing the reduction of RGB X-talk (%) when the first width W1 is increased with the reduction ratio of power consumption when the second width W2 increases as much as the increase in the first width W1.

For example, since the reduction of RGB X-talk (%), namely, about 10.5%, when the first width W1 increases from 200 μm to 400 μm is at least twice the reduction ratio of power consumption, for example, about 4.8%, when the second width W2 increases from 200 μm to 400 μm, the display apparatus, according to an exemplary embodiment of the present invention, increases the reduction of RGB X-talk due to a resistance (R) decrease by forming the first extension unit 13 having a greater first width W1 than the second width W2 of the second extension unit 23 within a restricted region of the substrate 100.

According to an embodiment of the present invention, by adjusting the width of a power supply line, the resistance (R) of the power supply line is reduced and RGB X-talk is reduced.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus, comprising:
   a substrate; and
   a display unit disposed on the substrate, the display unit comprising a display region and a non-display region disposed around the display region,
   wherein the display unit comprises:
      at least one light-emitting device disposed in the display region;
      a first power supply line and a second power supply line configured to supply driving power to the at least one light-emitting device; and
      a pad unit disposed at a side of the display region,
   wherein the first power supply line comprises a first fan-out wire portion electrically connected to the pad unit, and a first extension portion electrically connected to the first fan-out wire portion in the non-display region,
   the second power supply line comprises a second fan-out wire portion electrically connected to the pad unit, and a second extension portion electrically connected to the second fan-out wire portion in the non-display region, and
   wherein the first extension portion has a width W1 and the second extension portion has a width W2, and wherein the width W1 is greater than the width W2.

2. The display apparatus of claim 1, wherein the first power supply line further comprises a first body portion, wherein the first body portion extends in a first direction and the first body portion is disposed on a same side of the display region as the pad unit.

3. The display apparatus of claim 2, wherein the first extension portion extends from the first body portion in a second direction that crosses the first direction.

4. The display apparatus of claim 3, wherein the first extension portion includes at least two of first extension portions, wherein the at least two first extension portions extend in the second direction.

5. The display apparatus of claim 3, wherein the second power supply line further comprises a second body portion, wherein the second body portion surrounds both ends of the first body portion, and the second body portion surrounds all sides of the display region except for the side of the display region on which the pad unit is disposed.

6. The display apparatus of claim 5, wherein the second extension portion includes a pair of second extension portions, wherein the first extension portion is disposed between the pair of second extension portions, wherein each of the pair of first extension portions extends from the second body portion in a direction parallel to the first extension portion.

7. The display apparatus of claim 6, further comprising at least two third power supply lines disposed on different sides of the display region,
wherein each of the at least two third power supply lines is connected to the pad unit.

8. The display apparatus of claim 7, wherein each of the at least two third power supply lines includes a third fan-out portion connected to the pad unit, wherein the pair of second extension portions is disposed closer to the first extension portion than the third fan-out portions.

9. The display apparatus of claim 7, wherein each of the at least two third power supply lines includes a third fan-out portion connected to the pad unit, wherein the pair of second extension portions is disposed farther from the first extension portion than the third fan-out portions.

10. The display apparatus of claim 1, wherein the width W1 is about 100 μm to about 5 mm.

11. The display apparatus of claim 1, wherein the width W2 is about 100 μm to about 5 mm.

12. The display apparatus of claim 1, wherein the first power supply line further comprises a first body portion, and the second power supply line further comprises a second body portion,
wherein a length L1 is a sum of a length of the first body portion in a second direction, a length of the first extension portion in the second direction, and a length of the first fan-out wire portion in the second direction, and
a length L2 is a sum of a length of the second body portion in the second direction, a length of the second extension portion in the second direction, and a length of the second fan-out wire portion in the second direction.

13. The display apparatus of claim 12, wherein a ratio of the length L1 with respect to the width W1 of the first extension portion is less than 10.

14. The display apparatus of claim 12, wherein a ratio of the length L2 with respect to the width W2 of the second extension portion is less than 20.

15. The method of claim 12, wherein, when the length L1 is equal to the length L2, the width W1 of the first extension portion is more than twice the width W2 of the second extension portion.

16. The display apparatus of claim 1, wherein the display portion further comprises a bending region that is disposed in the non-display region, and wherein the bending region is bent or folded.

17. The display apparatus of claim 16, wherein, in the bending region, the width W1 of the first extension portion is greater than the width W2 of the second extension portion.

18. The display apparatus of claim 16, wherein
the display portion further comprises data fan-out wires that apply data voltages to the display region, and
in the bending region, the data fan-out wires are disposed on a same layer as the first power supply line and the second power supply line.

19. The display apparatus of claim 2, wherein the width W1 is a width of the first extension portion in the first direction, and the width W2 is a width of the second extension portion in the first direction.

20. The display apparatus of claim 6, wherein
the width W1 is a width of the first extension portion along the first direction, and
the width W2 is a width of one of the pair of second extension portions along the first direction.

21. The display apparatus of claim 1, wherein a first voltage, applied to the first power supply line, is greater than a second voltage, applied to the second power supply line.

22. The display apparatus of claim 21, further comprising at least one thin film transistor disposed on the substrate,
wherein the at least one light-emitting device is an organic light-emitting device that comprises a first electrode electrically connected to the at least one thin film transistor, a second electrode opposite to the first electrode, and an intermediate layer disposed between the first electrode and the second electrode.

23. The display apparatus of claim 21, wherein the first voltage is applied to the first electrode and the second voltage is applied to the second electrode.

24. The display apparatus of claim 1, further comprising an encapsulation unit disposed on the substrate, wherein the encapsulation unit protects the display unit from external moisture and oxygen.

25. The display apparatus of claim 24, wherein the encapsulation unit comprises at least one of tin fluorophosphates glass, chalcogenide glass, tellurite glass, borate glass, and phosphate glass.

26. The display apparatus of claim 24, wherein
the encapsulation unit comprises at least one inorganic layer and at least one organic layer, and
the at least one inorganic layer and the at least one organic layer comprise silicon oxide, the silicon oxide comprising carbon and hydrogen.

27. The display apparatus of claim 26, wherein
the encapsulation unit comprises an organic layer disposed between inorganic layers,
wherein a dam unit is disposed in the non-display region to surround at least a portion of the display region, and
the inorganic layers cover the dam unit and contact each other outside the dam unit.

28. A display apparatus, comprising:
a substrate including a display region and a non-display region;
a thin film transistor disposed on the substrate;
at least one light-emitting device electrically connected to the thin film transistor;
a power supply line disposed on the substrate and configured to supply driving power to the at least one light-emitting device; and
a pad unit disposed on the substrate in the non-display region,
wherein the first power supply line comprises a first fan-out wire portion connected to the pad unit, and a first extension portion connected to the first fan-out wire portion,
the second power supply line comprises a second fan-out wire portion connected to the pad unit, and a second extension portion connected to the second fan-out wire portion, and
wherein the first extension portion has a width W1 and the second extension portion has a width W2, and wherein the width W1 is greater than the width W2.

29. The display apparatus of claim 28, wherein
the at least one light-emitting device is an organic light-emitting device that comprises a first electrode electrically connected to the at least one thin film transistor, a second electrode opposite to the first electrode, and an intermediate layer disposed between the first electrode and the second electrode, and the first power supply line is electrically connected to the first electrode, and the second power supply line is electrically connected to the second electrode.

30. The display apparatus of claim 28, wherein the first power supply line further comprises a first body portion extending in a first direction to face a side of the display region on which the pad unit is disposed, and the second power supply line further comprises a second body portion that surrounds both ends of the first body portion, and the second body portion surrounds all sides of the display region except for the side of the display region on which the pad unit is disposed.

31. The display apparatus of claim 30, wherein a length L1 is a sum of a length of the first body portion in a second direction, a length of the first extension portion in the second direction, and a length of the first fan-out wire portion in the second direction, and a length L2 is a sum of a length of the second body portion in the second direction, a length of the second extension portion in the second direction, and a length of the second fan-out wire portion in the second direction.

32. The display apparatus of claim 30, wherein a ratio of the length L1 with respect to the width W1 of the first extension portion is less than 10, and a ratio of the length L2 with respect to the width W2 of the second extension portion is less than 20.

33. The display apparatus of claim 28, wherein the display unit further comprises a bending region disposed in the non-display region, wherein the bending region is bent or folded.

34. The display apparatus of claim 33, wherein, in the bending portion, the width W1 of the first extension portion is greater than the width W2 of the second extension portion.

35. A display apparatus, comprising:

a substrate; and a display unit disposed on the substrate, the display unit comprising a display region and a non-display region disposed around the display region, wherein the display unit comprises:

a first light-emitting device disposed in the display region;

a first power supply line and a second power supply line configured to supply driving power to the first light-emitting device; and a pad unit disposed in the non-display region, wherein the first power supply line comprises, in the non-display region, a pair of first fan-out wire portions electrically connected to the pad unit, a pair of first extension portions, each electrically connected to each of the pair of first fan-out wire portions, respectively, and a first body portion connected to each of the pair of first extension portions, and the second power supply line comprises, in the non-display region, a pair of second fan-out wire portions electrically connected to the pad unit, a pair of second extension portions, each electrically connected to each of the pair of second fan-out wire portions, respectively, and a second body portion connected each of the pair of second extension portions, wherein each of the pair of second extension portions is disposed on opposite sides of the pair of the first extension portions, and wherein one of the pair of first extension portion has a width W1 and one of the pair of second extension portion has a width W2, and wherein the width W1 is greater than the width W2.

36. The display apparatus of claim 35, wherein the first body portion extends in a first direction, and each of the pair of first extension portions extends in a second direction that crosses the first direction.

37. The display apparatus of claim 36, wherein at least a part of the first body portion is disposed between the second body portion and the display region.

38. The display apparatus of claim 36, wherein the widths W1 and W2 are measured along the first direction.

39. The display apparatus of claim 35, wherein the first body portion and one of the pair of first extension portions forms a T shape.

40. The display apparatus of claim 36, further comprising first dependent lines, wherein the first dependent lines extend in the second direction and are respectively connected to the first body portion, wherein the first dependent lines extend in both the display and non-display regions.

41. The display apparatus of claim 36, wherein the pair of first extension portions are separated from each other by a gap.

42. The display apparatus of claim 35, wherein the first light-emitting device is an organic light-emitting diode.

* * * * *